United States Patent [19]

Donson et al.

[11] Patent Number: 4,690,833

[45] Date of Patent: Sep. 1, 1987

[54] PROVIDING CIRCUIT LINES ON A SUBSTRATE

[75] Inventors: William A. Donson; James V. Ellerson, both of Endicott; Richard B. Hammer, Apalachin; William Lafer, Chenango Bridge; Keith A. Snyder, Vestal, all of N.Y.

[73] Assignee: International Business Machines Corporation, Armonk, N.Y.

[21] Appl. No.: 845,316

[22] Filed: Mar. 28, 1986

[51] Int. Cl.$^4$ .............................................. B05D 5/12
[52] U.S. Cl. ....................................... 427/96; 156/656; 156/661.1; 427/97; 427/184; 427/264; 427/272; 427/273; 427/282; 430/312; 430/313
[58] Field of Search .................... 427/96, 97, 282, 264, 427/272, 273, 184; 156/656, 661.1; 430/312, 313

[56] References Cited

U.S. PATENT DOCUMENTS

| | | | |
|---|---|---|---|
| 3,873,313 | 3/1975 | Horst et al. | 96/36 |
| 3,904,492 | 9/1975 | Rich et al. | 204/38 B |
| 3,934,336 | 1/1976 | Morse | 29/627 |
| 4,003,877 | 1/1977 | Lipson et al. | 260/47 UA |
| 4,017,968 | 4/1977 | Weglin | 29/625 |
| 4,064,287 | 12/1977 | Lipson et al. | 427/53 |
| 4,157,936 | 6/1979 | Piazza | 156/659 |
| 4,179,800 | 12/1979 | Takaba et al. | 29/625 |
| 4,180,604 | 12/1979 | Feng et al. | 430/270 |
| 4,243,700 | 1/1981 | Piazza | 427/195 |
| 4,259,421 | 3/1981 | Goldman | 430/5 |
| 4,270,985 | 6/1981 | Lipson et al. | 204/15 |
| 4,301,189 | 11/1981 | Arai et al. | 427/96 |
| 4,310,571 | 1/1982 | Daniele et al. | 427/96 |
| 4,312,897 | 1/1982 | Reimann | 427/96 |
| 4,401,686 | 8/1983 | Durand | 427/13 |
| 4,421,814 | 12/1983 | Piazza | 428/195 |
| 4,470,872 | 9/1984 | Sudo et al. | 156/630 |
| 4,481,049 | 11/1984 | Reichmanis et al. | 156/643 |
| 4,486,466 | 12/1984 | Leech et al. | 427/96 |
| 4,508,754 | 4/1985 | Stepan | 427/96 |
| 4,521,274 | 6/1985 | Reichmanis et al. | 156/643 |
| 4,529,477 | 7/1985 | Lundberg et al. | 427/96 |

*Primary Examiner*—Janyce A. Bell
*Attorney, Agent, or Firm*—Pollock, Vande Sande & Priddy

[57] ABSTRACT

A process for providing circuit lines on a substrate having a non-planar surface is provided. The process includes applying a layer of photoresist material to the substrate, selectively screen printing on non-planar areas of the substrate a screen-printable coating, photoprocessing the layer of photoresist material, and providing electrical conductive pattern on the substrate.

17 Claims, No Drawings

PROVIDING CIRCUIT LINES ON A SUBSTRATE

DESCRIPTION

1. Technical Field

The present invention is concerned with providing circuit lines on a substrate. In particular, the present invention is concerned with providing circuit lines on a substrate that has a non-planar surface.

The present invention provides a method for preventing voids or undercutting of resist in the vicinity of non-planar regions or contoured surfaces of the substrate.

2. Background Art

An example of an integrated circuit carrier includes copper deposited, for instance, on a ceramic substrate such as alumina.

A thin chrome layer is initially deposited on the substrate for adhesive reasons, then the copper conductor is deposited, followed by another thin chrome layer. The latter chrome layer is added as a solder barrier. Fine line patterns are generated with photoresist and conventional expose and develop techniques.

After the input/output pins are inserted into the substrate, solder is applied to the substrate and will deposit on the input/output pins and the exposed copper regions, but not on the substrate itself and not on the exposed chrome areas.

One problem experienced with the above particular technique is that the application of conventional liquid photoresist compositions by the common techniques employed, such as spraying, require reduced viscosities such that when the photoresist is coated over an outside corner or edge, such as a hole edge of the substrate, thinning takes place and resultant breakdown in subsequent etching processes can occur. Accordingly, conventional liquid photoresists when employed on non-planar or contoured areas of a substrate, such as in the vicinity of a chamfered pin hole, will not adequately protect the sharp rims against the etchant employed for the metal. This, in turn, can cause rim-voids and non-electrical continuity.

The problem encountered in the vicinity of non-planar areas of the substrate could, however, be obviated by employing coating techniques and materials other than conventional liquid photoresists such as by employing dry film lamination or screen printing. However, these techniques are not especially attractive since such exhibit deleterious effects on the limits of the line resolution. For instance, the thinnest dry film resist readily available today is about 25 micrometers, resulting in etched line resolution of similar magnitude. On the other hand, sprayed coatings can be about one-fourth of that value, thereby yielding much better resolution as is currently practiced.

SUMMARY OF INVENTION

The present invention provides for retaining very good resolution achieved by the conventional liquid photoresists employed, along with obtaining adequate coverage of the non-planar or contoured areas of the substrate. In particular, the present invention is concerned with a process for providing circuit lines on a substrate wherein the substrate has non-planar areas or contoured areas. The process includes applying a layer of photoresist material to the substrate and also selectively screen printing on or in the vicinity of the non-planar areas of the substrate, a screen printable coating.

The layer of photoresist material is photoprocessed, and a predetermined electrical conductivity pattern is provided on the substrate.

The screen printable coating has sufficient viscosity so as to resist pull back and thinning at the corners or edges of the contoured surface to thereby prevent undercutting or voids. The photosensitive resist material is applied to the other portions of the substrate, thereby providing the capability for defining the fine line portions of the circuit pattern. Since the screen printable coating is thicker than the photosensitive layer, the resolution capabilities of the screen printing defines the lower limit of the lines that are defined over the steps or edges of the substrate, but not over the remaining portions of the substrate where the photosensitive resist material is employed.

BEST AND VARIOUS MODES FOR CARRYING OUT THE INVENTION

The substrates employed in the process of the present invention are generally ceramic substrates having preformed holes through which input/output pins can be inserted so as to protrude from one surface of the substrate for insertion into or surface mount on circuit cards or circuit boards. In addition, the pins contact the circuitry on the back side of the substrate which, in turn, connects to the integrated circuit chip or chips mounted on the back side of the substrate. A ceramic is a product or material manufactured by the action of heat on earthly raw materials. The preferred ceramic substrates include silicon oxides and silicates such as aluminum silicate and aluminum oxides.

In addition, prior to the coating with the photoresist material and with the screen printable material in accordance with the present invention, the substrate is preferably metallized by providing a layer of chrome followed by a layer of copper followed by another layer of chrome.

Typically, the first layer of chrome is about 800 angstroms, the intermediate layer of copper is about 80,000 angstroms, and the final layer of chrome is about 800 angstroms thick.

If desired, before and/or after the metallization the substrate can be precleaned to remove any undesired foreign materials therefrom. Suitable precleaning agents include Shipley Neutrclean 68, J100, and isopropyl alcohol.

In accordance with the present invention, a photosensitive material is applied to the substrate on at least the planar areas of the substrate and preferably the entire substrate. The photosensitive material can be a positive photosensitive material or preferably a negative photosensitive material. A positive photosensitive material is one which, upon exposure to actinic radiation, is capable of being rendered soluble in the solvent in which the unexposed resist is not soluble. A negative photosensitive material is one which is capable of polymerizing and insolubilizing upon exposure to actinic radiation.

Example of some photosensitive materials which can be employed according to the present invention include negative or photohardenable polymerizable compositions such as of the type suggested in U.S. Pat. Nos. 3,469,982; 3,526,504; and 3,448,089, disclosures of which are incorporated herein by reference. The polymers of methylmethacrylate with glycidyl acrylate and/or pentaerythritol triacrylate are known negative photosensitive materials.

Other negative photosensitive resins include polyvinyl cinnamate derivatives such as those available under the trade designations KPR, KPR-2, KPR-3, and KPR-4; Waycoat RC and 20 and polymers of a vinyl ester containing cinnamylidene such as available from Eastman Kodak under the trade designation KOR; allyl ester prepolymers such as available from Dynachem under the trade designation DCR. A particular example of an allyl ester resin is from diallyl isophthalate. Other negative photosensitive materials include cyclized derivatives of polyisoprene rubber such as those available under the trade designation KMER and KTFR from Eastman Kodak; Dynachem CMR and Micro-G; Waycoat IC, Waycoat SC, and Waycoat 450, and hydrocarbon copolymers such as those available under the trade designations Dynachem CMR series.

In addition, the photosensitive compositions may include a sensitizer for the polymer. Such is generally employed in minor amounts such as about 1% to about 10%. Since such sensitizers are well-known in the art, a detailed discussion of them is not deemed necessary at this time. In addition, other additives to the negative resists such as phenolic-formaldehyde novolak resins in minor amount for improving properties such as adhesion and reducing swelling during development have been suggested.

A discussion of various negative photoresist materials and solvents and additives therefor can be found, for instance, in *Photoresist Materials and Processes,* DeForest, MacGraw-Hill Book Company, New York, N.Y., 1975, pages 20-47, disclosure of which is incorporated herein by reference.

Examples of some positive photoresist materials employed according to the present invention are from copolymers of methylmethacrylate and another acrylate or methacrylate monoester.

An example of another type of photosensitive material is based upon phenolic-formaldehyde novolak polymers. A particular example of such is Shipley AZ-1350 which is an m-cresol formaldehyde novolak polymer composition. Such is a positive resist composition and includes therein a diazoketone such as 2-diazo-1-naphthol-5-sulphonic acid ester. In such a composition, the ortho diazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight of the diazoketone compound. A discussion of various photosensitive materials can be found, for instance, in Journal of the Electrochemical Society, Volume 125, Number 3, March, Deckert, et al., "Microlithography-Key to Solid State Fabrication", pages 45C-56C, disclosure of which is incorporated herein by reference.

Usually the viscosity of the composition applying the photosensitive material is about 31 to about 35 zahn.

Although it is preferred to apply the photosensitive composition by spraying, other known techniques such as flowing, roller coating, spinning, and dip coating can be employed if desired.

After the photosensitive composition is applied to the substrates the solvent for the photosensitive material is removed by evaporation. The evaporation can be aided, if desired, by low temperature baking. Removal of the solvent leaves a layer of resist material on the surface of the substrate. The layer of photosensitive material is usually about 10 to about 80 kiloangstroms thick and preferably about 30 to about 50 kiloangstroms thick.

The photosensitive material is then exposed to actinic radiation in the desired pattern and then developed. When the photosensitive material is a positive resist, the exposed material is removed by a solvent, whereas, when the photosensitive material is a negative resist, the unexposed portion is removed by a suitable solvent.

When employing a photoresist such as Waycoat-SC 100 or Kodak KTFR, the unexposed portion is removed by employing a suitable solvent such as methyl chloroform or xylene, followed by a Freon rinse.

Since the methods of exposing and developing both positive and negative photoresists are well-known in the art, such need not be described herein in any great detail. After development of the photosensitive material to provide the desired pattern on the substrate, the photosensitive material can be post baked to assure against undercutting during the subsequent processing. For instance, such can be post baked at a temperature of about 80° C. to about 140° C. and preferably about 90° C. to about 120° C.

A screenable, printable coating is selectively screen printed on non-planar areas of the substrate to provide the desired pattern for electrical conductivity lines within the vicinity of the contours of the substrate such as the holes thereof. Normally, the screen printable coating is applied to, at most, only about 25% of the substrate. In preferred aspects, such is deposited only to define a donut-like shape around an edge around each pin hole provided on the substrate, as well as a short lead-in line of the circuit. The screen printable composition can actually fill the holes at this stage of the process. The printable composition should be resistant to the materials used to etch the metals when defining the circuit pattern and preferably should not be soluble in the solvent for the photoresist material. However, this is not necessary when the photoresist is developed prior to coating in the desired portions with the screen printable composition. The screen printable composition is preferably not photosensitive, but could be, if desired. Examples of screen printable compositions can be found in U.S. Pat. Nos. 4,064,287; 4,003,877; 4,270,985; 4,246,147 and 4,292,230, disclosures of which are incorporated herein by reference. Some commercially available, suitable, screen printable compounds are Dynachem TR2055, Nazdar 205, and HySol.

A suitable commercially available screen printable composition is Dynachem TR2055 which is a rubber based resin composition. The screenable compositions employed generally have a viscosity of about 35 to about 68 centipoise at about 21° C. at 1 rpm. The screen printable composition is applied by screen printing to the contoured areas of the substrate such as around the holes and, if desired, have sufficient viscosity so that such can actually cover the holes. The screen printable compositions are dried such as at about 100° C. for about 5 minutes. The screen printable compositions provide a film of about 15 to about 80 microns thick and preferably about 40±20 microns thick.

In fact, the composition can actually fill or clog the holes at this stage of the process. This further assures against voids or undercutting in the vicinity of the non-planar areas of the substrate. By limiting the screen printable composition to those areas that are non-planar and within the vicinity of the non-planar areas of the substrate, the loss in high resolution as obtainable by the conventional photosensitive materials is minimized. The process of the present invention allows for very large diameter hole coverage such as those having diameters of about 0.016" to about 0.06".

The present invention contemplates coating the non-planar areas of the substrate with the screen printable composition prior to or subsequent to coating with the photosensitive composition. However, in the preferred aspects of the present invention, the photoresist material is coated first onto the entire substrate and is developed prior to applying the screen printable composition. However, even if coated prior to the screen printable composition, it is not necessary to develop the photosensitive composition prior to coating with the screen printable composition.

Next, the metallic pattern is provided such as by selectively etching the chrome/copper/chrome layers present on the substrate. Well-known etching compositions can be employed for this purpose.

After the preselected metallic pattern is provided on the substrate, the screen printable composition is removed such as by employing a solvent capable of dissolving the screenable coating. In the case of Dynachem TR2055, methylchloroform can be employed. Next, the remaining portion of the photosensitive material is removed such as by stripping with J-100.

The following non-limiting example is presented to further illustrate the present invention.

EXAMPLE

Onto an aluminum oxide ceramic substrate having chamfered holes of about 10 to about 15 mils in diameter and having an 800 angstrom layer of chrome on top of which is an 80,000 angstrom layer of copper on top of which is another 800 angstrom layer of chrome is blanket sprayed a photosensitive composition of Waycoat-SC 100 diluted with xylene and having a viscosity of about 33±2 CAHM. The coating is dried by heating at about 90° C. for about 10 minutes. Such is then exposed to actinic radiation of about 365 nanometers wavelength and then developed by immersing in methylchloroform, followed by a Freon TF rinse to provide a preselected pattern. The composition is then post baked at a temperature of about 120° C. for about 15 minutes.

Onto the coated substrate is screened a screenable composition being Dynachem Ink Resist TR2055 into the chamfered pin holes and over the photoresist material in the vicinity of the pin holes and other uneven areas of the substrate. The screenable resist composition is dried in an infrared oven at about 100° C. for about 15 minutes. The preselected areas of the chrome-copper-chrome layers are etched by immersing the article in potassium permangenate and sodium hydroxide solution for etching the chrome and by immersing the article in ferric chloride for etching the copper.

The screenable Dynachem TR2055 layer is removed by immersing in methylchloroform followed by a Freon TF rinse. The remaining photoresist is removed by employing J100.

The product obtained demonstrates high resolution in the planar regions of the substrate, as well as providing electrical continuity to the pin holes and preventing voids there.

Line width of 1 mil to 10 mils are regularly produced with finer line dimensions readily obtainable.

Having thus described our invention, what we claim as new and desire to secure by Letters Patent is:

1. A process for providing circuit lines on a substrate wherein said substrate has non-planar areas which comprise:
   applying a layer of photoresist material in a liquid form to said substrate;
   selectively screen printing on non-planar areas of the substrate a screen printable coating wherein said screen printable coating has sufficient viscosity so as to resist pull back and thinning at the corners of the contoured surface to thereby prevent undercutting or voids;
   photoprocessing said layer of photoresist material; and
   providing predetermined electrically conductive pattern on said substrate.

2. The process of claim 1 wherein said photoresist material is a negative photoresist material.

3. The process of claim 1 wherein as screen printable coating is resistant to etchants for copper and chrome.

4. The process of claim 1 wherein said substrate is a ceramic.

5. The process of claim 1 wherein said substrate has pin holes.

6. The process of claim 5 wherein said pin holes are chamfered holes.

7. The process of claim 4 wherein said ceramic includes a layer of chrome followed by a layer of copper followed by a layer of chrome thereon.

8. The process of claim 1 wherein said layer of photoresist material is about 10 to about 80 kiloangstroms thick and said screen printable coating is about 15 to about 80 microns thick.

9. The process of claim 1 wherein said layer of photoresist material is about 30 to about 50 kiloangstroms thick.

10. The process of claim 9 wherein said screen printable coating is about 40±20 microns thick.

11. The process of claim 1 wherein said layer of photoresist material is applied prior to applying said screen printable coating.

12. The process of claim 11 wherein said layer of photoresist material is developed prior to applying said screen printable coating.

13. The process of claim 1 wherein said layer of photoresist material is applied by blanket spraying the substrate.

14. The process of claim 5 wherein said screen printable composition fills said pin holes.

15. The process of claim 1 wherein said substrate is a metallized ceramic and the predetermined electrically conductive pattern is provided by etching the metal of said metallized ceramic.

16. The process of claim 7 wherein the predetermined electrically conductive pattern is provided by etching each of the layers of chrome and copper.

17. The process of claim 16 wherein said substrate has pin hole and wherein said screen printable composition fills said pin holes.

* * * * *